US011417599B2

(12) United States Patent
Chen et al.

(10) Patent No.: US 11,417,599 B2
(45) Date of Patent: *Aug. 16, 2022

(54) PLURALITY OF DIFFERENT SIZE METAL LAYERS FOR A PAD STRUCTURE

(71) Applicant: Taiwan Semiconductor Manufacturing Company, Ltd., Hsinchu (TW)

(72) Inventors: Hsien-Wei Chen, Hsinchu (TW); Ching-Jung Yang, Pingzhen (TW); Chia-Wei Tu, Chunan Town (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/876,238

(22) Filed: May 18, 2020

(65) Prior Publication Data

US 2020/0279802 A1 Sep. 3, 2020

Related U.S. Application Data

(63) Continuation of application No. 16/397,303, filed on Apr. 29, 2019, now Pat. No. 10,658,290, which is a
(Continued)

(51) Int. Cl.
*H01L 23/34* (2006.01)
*H01L 23/48* (2006.01)
(Continued)

(52) U.S. Cl.
CPC .......... *H01L 23/528* (2013.01); *H01L 21/486* (2013.01); *H01L 21/4846* (2013.01);
(Continued)

(58) Field of Classification Search
CPC .............. H01L 23/3192; H01L 23/481; H01L 23/5229; H01L 21/76877; H01L 23/49816;
(Continued)

(56) References Cited

U.S. PATENT DOCUMENTS 5,700,735 A 12/1997 Shiue et al.
6,291,331 B1 9/2001 Wang et al.
(Continued)

FOREIGN PATENT DOCUMENTS

DE 102005009164 A1 9/2006
TW 200705636 A 2/2007
(Continued)

*Primary Examiner* — Alonzo Chambliss
(74) *Attorney, Agent, or Firm* — Slater Matsil, LLP

(57) ABSTRACT

Methods and apparatus are disclosed for manufacturing metal contacts under ground-up contact pads within a device. A device may comprise a bottom metal layer with a bottom metal contact, a top metal layer with a top metal contact, and a plurality of middle metal layers. Any given metal layer of the plurality of middle metal layers comprises a metal contact, the metal contact is substantially vertically below the top metal contact, substantially vertically above the bottom metal contact, and substantially vertically above a metal contact in any metal layer that is below the given metal layer. The metal contacts may be of various and different shapes. All the metal contacts in the plurality of middle metal layers and the bottom metal contact may be smaller than the top metal contact, therefore occupying less area and saving more area for other functions such as device routing.

20 Claims, 6 Drawing Sheets

Related U.S. Application Data continuation of application No. 15/714,124, filed on Sep. 25, 2017, now Pat. No. 10,276,496, which is a continuation of application No. 13/787,673, filed on Mar. 6, 2013, now Pat. No. 9,773,732.

(51) Int. Cl.

| | | |
|---|---|---|
| *H01L 21/00* | (2006.01) | |
| *H01L 21/4763* | (2006.01) | |
| *H01L 23/528* | (2006.01) | |
| *H01L 21/48* | (2006.01) | |
| *H01L 21/768* | (2006.01) | |
| *H01L 23/498* | (2006.01) | |
| *H01L 23/532* | (2006.01) | |
| *H01L 23/522* | (2006.01) | |
| *H01L 23/00* | (2006.01) | |
| *H01L 23/31* | (2006.01) | |

(52) U.S. Cl.
CPC ...... *H01L 21/76877* (2013.01); *H01L 23/481* (2013.01); *H01L 23/49822* (2013.01); *H01L 23/49827* (2013.01); *H01L 23/5226* (2013.01); *H01L 23/5329* (2013.01); *H01L 24/05* (2013.01); *H01L 23/3192* (2013.01); *H01L 23/49816* (2013.01); *H01L 23/53214* (2013.01); *H01L 23/53228* (2013.01); *H01L 23/53257* (2013.01); *H01L 23/53295* (2013.01); *H01L 2224/13* (2013.01)

(58) Field of Classification Search
CPC ............... H01L 23/528; H01L 21/4846; H01L 23/53295; H01L 23/49822; H01L 23/53214; H01L 23/53228; H01L 23/5327; H01L 23/5329; H01L 23/49827; H01L 21/486
See application file for complete search history.

(56) References Cited

U.S. PATENT DOCUMENTS

| | | |
|---|---|---|
| 6,297,563 B1 | 10/2001 | Yamaha |
| 6,448,641 B2 | 9/2002 | Ker et al. |
| 7,081,679 B2 | 7/2006 | Huang et al. |
| 7,160,795 B2 | 1/2007 | Batra et al. |
| 7,202,565 B2 | 4/2007 | Matsuura et al. |
| 7,217,979 B2 | 5/2007 | Matsunaga et al. |
| 7,218,231 B2 | 5/2007 | Higham |
| 7,281,231 B2 | 10/2007 | Kan et al. |
| 7,495,288 B2 | 2/2009 | Matsunaga et al. |
| 7,741,716 B1 | 6/2010 | Venkitachalam et al. |
| 7,944,010 B2 | 5/2011 | Okada |
| 8,004,083 B2 | 8/2011 | Lin et al. |
| 8,119,115 B2 | 2/2012 | Snyder et al. |
| 8,399,954 B2 | 3/2013 | Furuta |
| 8,492,808 B2 | 7/2013 | Omori et al. |
| 8,581,423 B2 | 11/2013 | Chen et al. |
| 9,773,732 B2 | 9/2017 | Chen et al. |
| 10,276,496 B2 | 4/2019 | Chen et al. |
| 10,658,290 B2 * | 5/2020 | Chen ..................... H01L 23/528 |
| 2001/0010407 A1 | 8/2001 | Ker et al. |
| 2002/0006717 A1 | 1/2002 | Yamaha |
| 2002/0179991 A1 | 12/2002 | Varrot et al. |
| 2004/0031004 A1 | 2/2004 | Yoshioka |
| 2004/0145045 A1 | 7/2004 | Huang et al. |
| 2005/0082577 A1 | 4/2005 | Usui |
| 2007/0176292 A1 | 8/2007 | Chen et al. |
| 2009/0026621 A1 * | 1/2009 | Poddar ..................... H01L 24/05 257/760 |
| 2009/0121222 A1 | 5/2009 | Peng et al. |
| 2009/0127582 A1 | 5/2009 | Matsunaga et al. |
| 2012/0178252 A1 | 7/2012 | Liu et al. |
| 2013/0026622 A1 | 1/2013 | Chuang et al. |
| 2013/0087914 A1 * | 4/2013 | Yang ..................... H01L 21/563 257/738 |
| 2015/0318252 A1 | 11/2015 | Lu et al. |
| 2016/0172321 A1 * | 6/2016 | Gao ....................... H01L 24/13 257/737 |

FOREIGN PATENT DOCUMENTS

| | | |
|---|---|---|
| TW | 200729439 A | 8/2007 |
| TW | I319228 A | 8/2007 |
| TW | I408786 A | 6/2011 |
| WO | 03009379 A1 | 1/2003 |

* cited by examiner

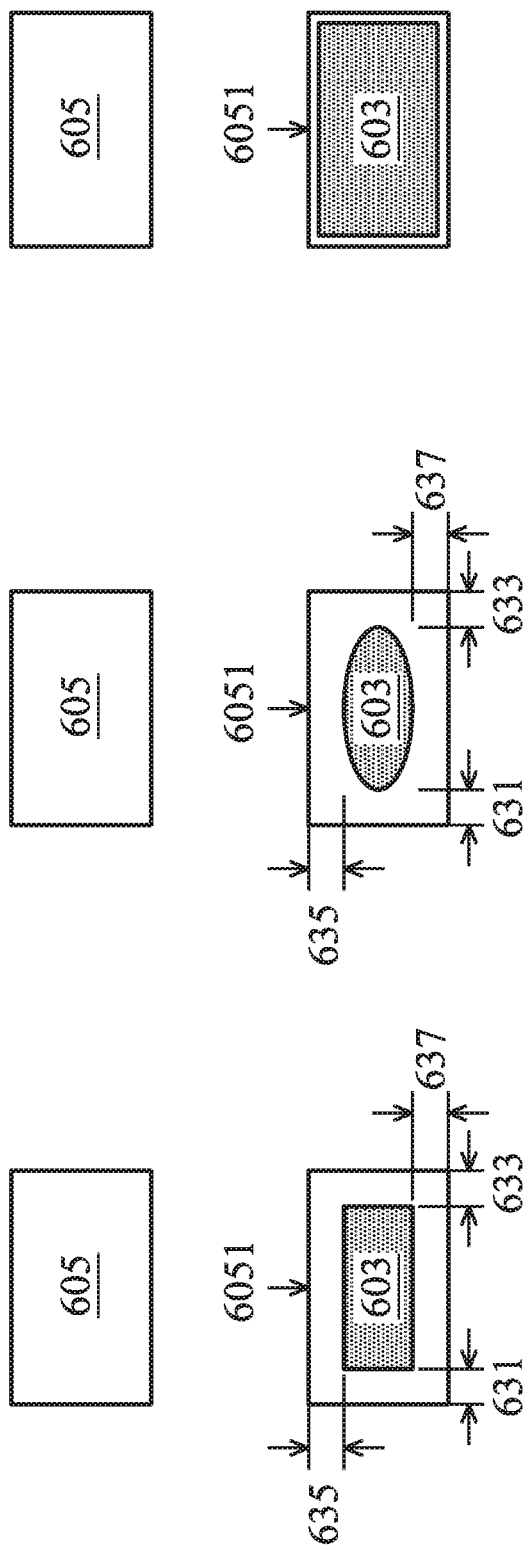

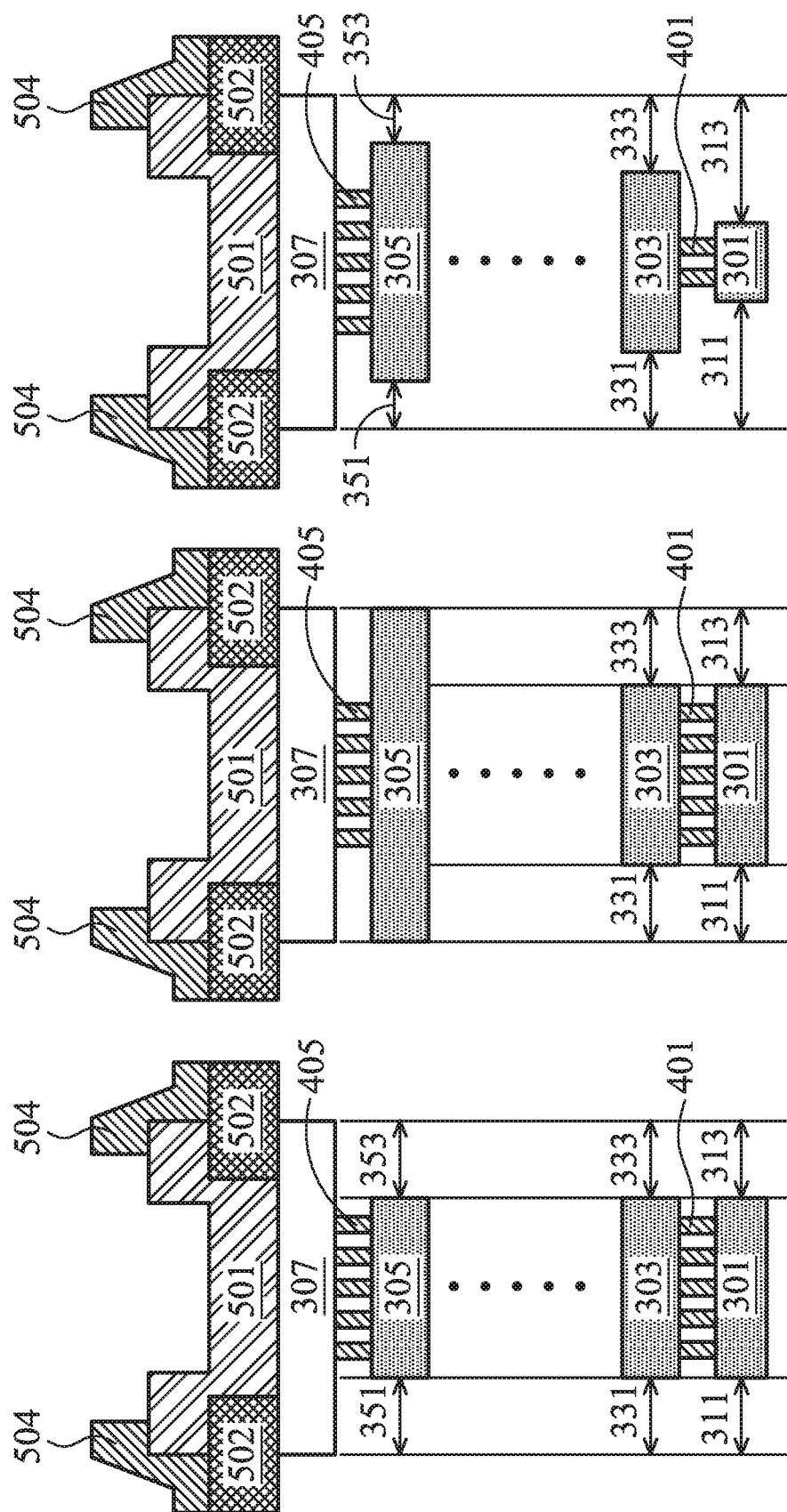

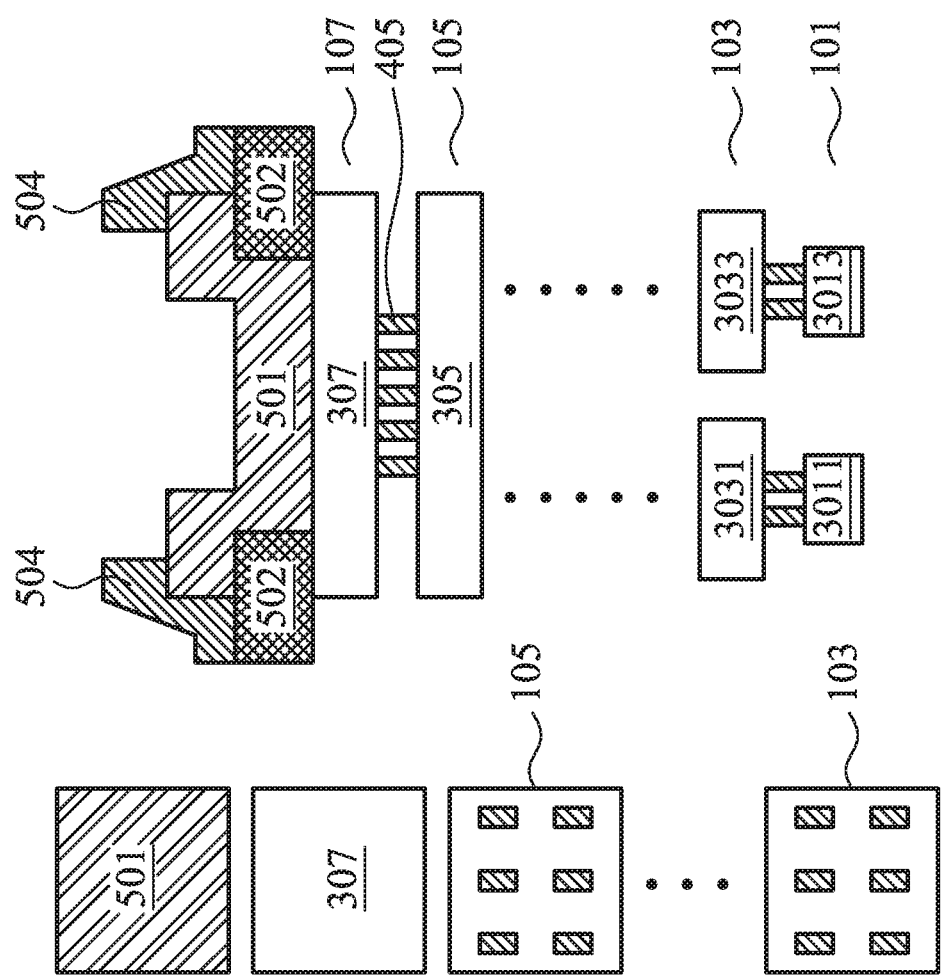
Figure 4(c)
Figure 4(b)
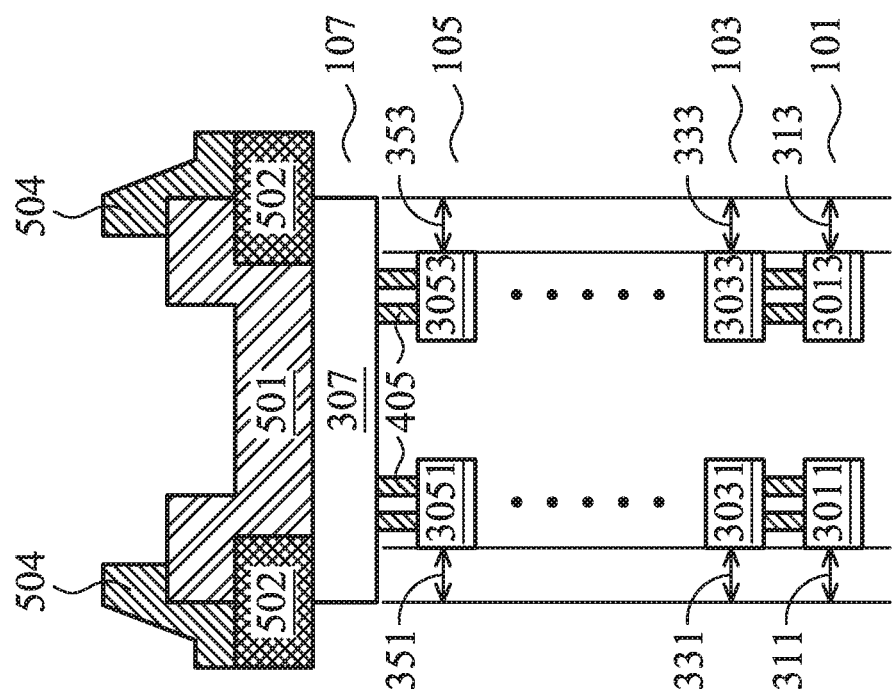
Figure 4(a)

PLURALITY OF DIFFERENT SIZE METAL LAYERS FOR A PAD STRUCTURE

PRIORITY CLAIM AND CROSS-REFERENCE

This application is a continuation of U.S. patent application Ser. No. 16/397,303, filed on Apr. 29, 2019, entitled "Plurality of Different Size Metal Layers for a Pad Structure," which is a continuation of U.S. patent application Ser. No. 15/714,124, filed on Sep. 25, 2017, now U.S. Pat. No. 10,276,496, issued Apr. 30, 2019, entitled "Plurality of Different Size Metal Layers for a Pad Structure," which is a continuation of and claims the benefit of U.S. patent application Ser. No. 13/787,673, filed on Mar. 6, 2013, now U.S. Pat. No. 9,773,732, issued Sep. 26, 2017, entitled "Method and Apparatus for Packaging Pad Structure," which applications are hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. These smaller electronic components also require smaller packages that utilize less area than previous packages. Some smaller types of packages for semiconductor devices include quad flat pack (QFP), pin grid array (PGA), ball grid array (BGA), flip chips (FC), three dimensional integrated circuits (3DIC), wafer level packages (WLP), wafer-level chip scale packages (WLCSP), and package on package (PoP) devices.

In a typical manufacturing process, active and passive devices may be made within a substrate, and connected by interconnect structures such as metal contacts formed on metallization layers and dielectric layers. Contact pads are formed above the metallization layers to make connections to packages. Typically, redistribution layer (RDL) or post-passivation interconnect (PPI) may be used to fan out wires for contact pads, followed by the formation of UBM layers connected to RDLs and solder balls on the UBM layers to establish electrical contacts between contact pads of a chip such as input/output pads and the substrate or lead frame of the package.

Ground-up contact pads can be used for packages such as flip-chip packages. Ground-up contact pads require no redistribution layer, instead UBM layers and solder balls are placed on ground-up contact pads directly, and ground-up contact pads are connected to metal contacts within a plurality of metal layers of the chip. However, conventional interconnects for ground-up contact pads occupy large areas of metal layers, which ultimately limit the areas available on metal layers for other functions such as device routing. Methods and apparatus are needed for reducing metal layer areas occupied by metal contacts under ground-up contact pads, and at the same time, increasing the area available for other purposes such as device routing.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2(a)-2(e) illustrate an embodiment of the formation of a plurality of metal contacts under a ground-up contact pad;

FIGS. 3(a)-3(e) illustrate various embodiments of the formation of a plurality of metal contacts under a ground-up contact pad; and FIGS. 4(a)-4(c) illustrate further additional embodiments of the formation of a plurality of metal contacts under a ground-up contact pad.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION

Figure 1:
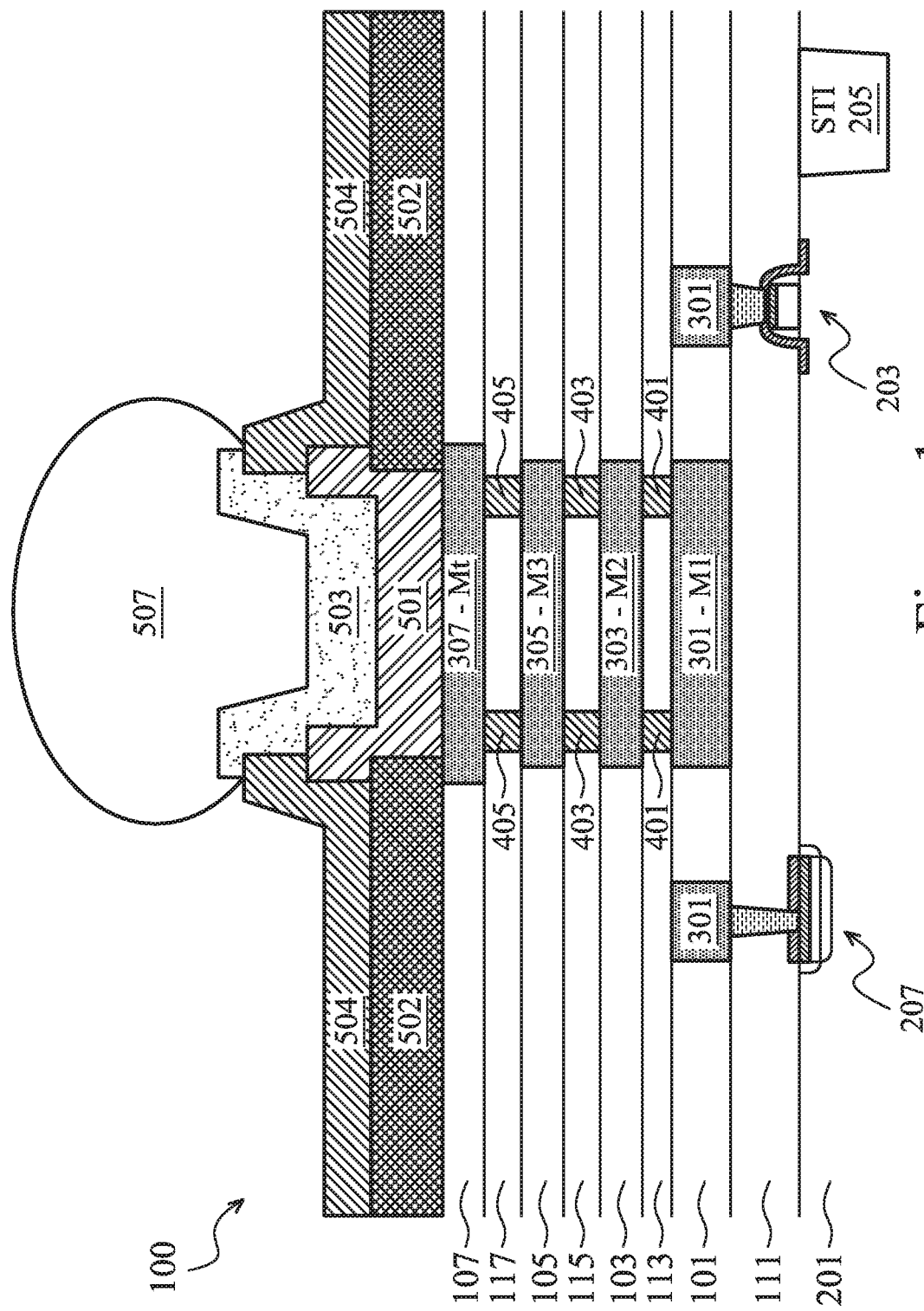
FIG. 1 illustrates an embodiment of a ground-up contact pad of a device above a plurality of metal contacts.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Methods and apparatus are disclosed for manufacturing metal contacts under ground-up contact pads within a device. A device may comprise a bottom metal layer with a bottom metal contact, a top metal layer with a top metal contact, and a plurality of middle metal layers. Any given metal layer of the plurality of middle metal layers comprises a metal contact, the metal contact is substantially vertically below the top metal contact, substantially vertically above the bottom metal contact, and substantially vertically above a metal contact in any metal layer that is below the given metal layer. The metal contacts may be of various and different shapes. All the metal contacts in the plurality of middle metal layers and the bottom metal contact may be smaller than the top metal contact, therefore occupying less area and saving more area for other functions such as device routing. The so formed metal contacts may also provide lower metal sheet resistance and reduced IR drop, with increased yield and reliability.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"-when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

A device 100 is illustrated in FIG. 1, wherein the device 100 comprises a ground-up contact pad 501. The device 100 comprises a substrate 201, which may contain active and passive devices, such as a transistor 203, an isolation area 205 which may be a shallow trench isolation area (STI), and another passive device 207. A bottom metal layer 101 is separated by an inter-layer dielectric (ILD) layer 111 from the substrate 201. The bottom metal layer 101 comprises a plurality of bottom metal contacts 301. The top metal layer is a term known to those with ordinary skill in the art. The metal layer 107 is the top metal layer of a chip so that there is no other metal layer above the metal layer 107 within the chip. The top metal layer 107 comprises a plurality of top metal contacts 307. The metal layers 103 and 105 are the middle metal layers between the bottom metal layer 101 and the top metal layer 107, comprising the middle metal contacts 303 and 305 respectively. Metal contacts 301, 303, 305, and 307 may be connected by vias such as 401, 403, and 405, respectively. The bottom metal layer 101, the top metal layer 107, and the middle metal layers 103 and 105 are separated by a plurality of inter-metal dielectric layers (IMD) 113, 115, and 117, respectively. In an embodiment there may be more than four layers of metallization separated from the substrate 201 by at least one ILD, but the precise number of metallization layers is dependent upon the design of the device 100.

The contact pad 501 may be formed on the surface of the top metal layer 107 in contact with the top metal contact 307. A passivation layer 502 may be formed on the top metal layer 107 with a first opening to expose the contact pad 501. A polymer layer 504 may be formed above the passivation layer 502, with a second opening contained within the first opening to expose the contact pad 501. An UBM layer 503 may be formed within the second opening of the polymer layer 504, and in contact with the contact pad 501. Furthermore, a solder ball 507 may be placed on the UBM layer 503 to connect the contact pad 501 to other packaging materials.

The contact pad 501 is connected to the UBM layer 503 directly without a redistribution layer, and it is further placed on a plurality of metal contacts 301, 303, 305, and 307. The contact pad 501 is a so-called ground-up contact pad. Such ground-up contact pads may be used for packages such as flip-chip packages. However, conventional ground-up contact pads have metal contacts under the ground-up contact pad occupying large areas of metal layers, which ultimately limit the areas available on metal layers for other functions such as device routing. The embodiment of the ground-up contact pad 501 shown in FIG. 1 has a plurality of metal contacts 301, 303, 305, and 307 occupying less area in the metal layers. More details of each component may be described below, while more details of the metal contacts 301, 303, 305, and 307 will be shown in FIGS. 2(*a*)-2(*e*), FIGS. 3(*a*)-3(*e*), and FIGS. 4(*a*)-4(*c*).

The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The substrate 201 may comprise active devices such as transistors 203, where a plurality of drain and source regions of transistors are formed within the substrate. Shallow trench isolation (STI) regions 205 and other passive devices 207 may be formed in substrate 201 as well. As one of ordinary skill in the art will recognize, a wide variety of other devices such as transistors, resistors, inductors and the like may be used to generate the desired structural and functional requirements of the design. The substrate 201 does not need to contain all of the different kinds of devices. The substrate 201 may contain only one kind of devices such as transistors 203. The transistors 203, the STI 205, and the passive device 207 may be formed using any suitable methods either within or else on the surface of the substrate 201.

The ILD layer 111 may be formed on the substrate 201, covering the gate of the transistors and other devices. The ILD layer 111 may be made of one or more suitable dielectric materials such as silicon oxide, silicon nitride, low-k dielectrics such as carbon doped oxides, extremely low-k dielectrics such as porous carbon doped silicon dioxide, the like, or a combination thereof. The ILD layer 111 may be formed through a process such as chemical vapor deposition (CVD), although any suitable process may be utilized.

The bottom metal layer 101 may be formed over the ILD layer 111, comprising a plurality of bottom metal contacts 301 connected to the devices within the substrate 201 by vias through the ILD layer 111. A middle metal layer 103 may be formed above the bottom metal layer 101 separated by an inter-metal dielectric (IMD) layer 113, and a plurality of metal contacts 303 may be located in the metal layer 103. Those metal contacts 303 may be called middle metal contacts since they are contained in a middle metal layer. Similarly, an additional middle metal layer 105 comprising middle metal contacts 305, and the top metal layer 107 comprising top metal contacts 307 may be formed above the middle metal layer 103 and separated by the IMD layer 115 and 117, respectively.

The bottom metal contacts 301, middle metal contacts 303, 305, and top metal contacts 307 within various metal layers 101, 103, 105, and 107 are connected by a plurality of vias 401, 403, and 405. The bottom metal contacts 301, middle metal contacts 303, 305, and top metal contacts 307 may be made with aluminum (Al), copper (Cu), titanium (Ti), or other electrically conductive material.

The number of metal layers 101, 103, 105, and 107, the number of IMD layers 113, 115, and 117, the number of vias 401, 403, and 405, and the number of metal contacts 301, 303, 305, and 307 are only for illustrative purposes and are not limiting. There could be other number of layers that is more or less than the four metal layers. There may be other number of IMD layers, and other number of vias, different from those shown in FIG. 1.

Each layer, such as the ILD layer 111, or the IMD layers 113, 115, and 117 may be deposited by methods including chemical vapor deposition (CVD) process, or plasma enhanced CVD (PECVD). The IMD layers 113, 115, and 117 are commonly known in the art as being the dielectric layers for forming metal contacts and vias therein. The IMD layers 113, 115, and 117 may have a thickness ranging from perhaps 500 Å to 30,000 Å. The patterning of the layers may be done using a damascene process or a dual damascene process. Damascene means formation of a patterned layer imbedded in another layer such that the top surfaces of the two layers are coplanar. An IMD is deposited either on a substrate, or on top of another existing layer of metal. Once the IMD is deposited, portions of the IMD may be etched away to form recessed features, such as trenches and vias, which can be filled with conductive material to connect different regions of the chip and accommodate the conductive lines. A damascene process which creates either only trenches or vias is known as a single damascene process. A damascene process which creates both trenches and vias at once is known as a dual damascene process.

A conductive layer may be formed as the contact pad 501 on a surface of a top metal contact 307 within the top metal layer 107. The contact pad 501 may be made with aluminum (Al), copper (Cu), tin (Sn), nickel (Ni), gold (Au), silver (Ag), or other electrically conductive material. The deposition of the contact pad 501 may use an electrolytic plating, sputtering, PVD, or electroless plating process. The size, shape, and location of the contact pad 501 are only for illustration purposes and are not limiting. The contact pad 501 may be formed to have a thickness of between about 0.5 µm and about 4 µm, such as about 1.45 µm. There may be a plurality of contact pads for the device 100, which are not shown.

The passivation layer 502 may be formed over the top metal layer 107 for structural support and physical isolation. The passivation layer 502 can be made with silicon nitride (SiN), silicon dioxide ($SiO_2$), silicon oxynitride (SiON), or other insulating material. An opening of the passivation layer 502 may be made by removing a portion of the passivation layer 502 using a mask-defined photoresist etching process to expose the contact pad 501. The size, shape, and location of the opening made are only for illustration purposes and are not limiting. The passivation layer 502 may be formed through a process such as chemical vapor deposition (CVD), although any suitable process may be utilized, and may have a thickness between about 0.5 µm and about 5 µm, such as about 9.25 KÅ.

A dielectric layer such as a polymer layer 504 may be formed over the passivation layer. The dielectric layer may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the polymer layer 504 may be between about 5 µm and about 30 µm, for example. Alternatively, the dielectric layer 504 may be an oxide layer or a nitride layer. An opening of the dielectric layer 504 may be made by removing a portion of the dielectric layer 504 using a mask-defined photoresist etching process to expose the contact pad 501.

The UBM layer 503 may be formed in electrical contact with the contact pad 501 within the opening of the dielectric layer 504. The UBM layer 503 may comprise a layer of conductive material, such as a layer of titanium, or a layer of nickel. The UBM layer 503 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, or any multiple layers made of materials such as titanium (Ti), tantalum (Ta), tantalum nitride (TaN), nickel (Ni), or copper (Cu), that are suitable for the formation of the UBM layer 503. Any suitable materials or layers of material that may be used for the UBM layer 503 are fully intended to be included within the scope of the current embodiments. The UBM layer 503 may be created using processes such as sputtering, or evaporation, depending upon the desired materials. The UBM layer 503 may be formed to have a thickness of between about 0.01 µm and about 10 µm, such as about 5 µm.

A solder ball or bump 507 may be placed on the UBM pad 503. Solder bumps are widely used to form electrical interconnect in flip chip technology or other types of technologies for IC packaging. Various sizes of solder balls or bumps are in use. A solder ball of a diameter size around 350 µm to 500 µm may be called a package bump and used to connect a device to a printed circuit board (PCB). A solder bump of a diameter size around 50 µm to 150 µm may be called a flip-chip bump and used to connect a device to a package substrate. The sizes of different solder balls or bumps are described for illustration purpose only and are not limiting. With the continuous reduction of feature sizes and package sizes, the sizes in embodiments may become smaller than the ones described above. On the other hand, the solder ball 507 may be of a bigger size such as a size of a flip-chip bump or a package bump as well, depending on the particular applications of interest. Alternatively, connectors other than a solder ball may be placed above the UBM pad 503 to make electrical connections.

The solder ball 507 may be a solder ball comprising an electrically conductive solder material, e.g., Sn, Ni, Au, Ag, Cu, bismuthinite (Bi) and alloys thereof, or combinations of other electrically conductive material. For example, the solder ball 507 may be a Cu/SnAg solder ball. Alternatively, a copper bump instead of a solder ball may be used as the solder ball 507.

More details of the plurality of metal contacts 301, 303, 305, and 307 under the ground-up contact pad 501 of FIG. 1 are illustrated in FIGS. 2(a)-2(e). Some general terms may be described first and demonstrated in FIGS. 2(a)-2(c). An embodiment of the metal contacts 301, 303, 305, and 307 may be shown in FIGS. 2(d)-2(e) in cross-section view and in top view.

As illustrated in FIG. 2(a) in top view, a metal contact 605 at one metal layer is above another metal contact 603 at another metal layer when the metal layer containing the metal contact 605 is above the metal layer containing the metal contact 603. Alternatively, the metal contact 605 may be the contact pad 501 shown in FIG. 1, and the metal contact 603 may be any metal contact of FIG. 1.

A metal layer is said to be below or above another metal layer based on their relative physical position in the layout layers of the chip. For example, as shown in FIG. 1, the metal layer 107 is the top metal layer so that there is no other metal layer above the top metal layer 107 within the chip. The top metal layer 107 is above all other metal layers 101, 103, and 105. The bottom metal layer 101 is below all other metal layers 103, 105, and 107. The middle metal layer 105 is above the middle metal layer 103. By a same idea, the contact pad 501 is above all the metal layers.

Two metal layers are adjacent if there is no other metal layer between the two metal layers. For example, as shown in FIG. 1, the middle metal layer 103 is adjacent to the middle metal layer 105, and also adjacent to the bottom metal layer 101. For two adjacent metal layers, the one at the upper layer is said to be the next above layer of the lower layer. For example, the metal layer 105 is the next above layer of the metal layer 103, and the top metal layer 107 is the next above layer of the metal layer 105. Similarly, the one at the lower layer is said to be at the next below layer of the upper layer. For example, the metal layer 103 is the next below layer of the metal layer 105, and the metal layer 105 is the next below layer of the top metal layer 107.

The metal layer containing the metal contact 605 may be any given metal layer of the plurality of middle metal layers 103 or 105 in FIG. 1, or the top metal layer 107 in FIG. 1. The metal layer containing the metal contact 603 may be any layer below the given metal layer containing the metal contact 605, such as the middle metal layer 103 or 105, or the bottom metal layer 101 in FIG. 1. For example, when the given metal layer containing the metal contact 605 is the top metal layer 107, then the metal layer containing the metal contact 603 may be any of the middle metal layer 103 or 105, or the bottom metal layer 101. Alternatively, when the given metal layer containing the metal contact 605 is the middle metal layer 105, then the metal layer containing the metal contact 603 may be the middle metal layer 103, or the bottom metal layer 101. On the other hand, when the given metal layer containing the metal contact 605 is the middle metal layer 103, then the metal layer containing the metal contact 603 may be the bottom metal layer 101, since the bottom metal layer 101 is the only metal layer below the middle metal layer 103.

As shown in FIG. 2(a), the area 6051 is the projected image of the metal contact 605 projected to the metal layer containing the metal contact 603, sometimes it is said to be the projection of the metal contact 605 onto the metal layer containing the metal contact 603. The metal contact 605 is substantially vertically above the metal contact 603 if the metal contact 603 is all or substantially contained within the projected image 6051. Similarly, the metal contact 603 is substantially vertically below the metal contact 605 if the metal contact 603 is all or substantially contained within the projected image 6051.

The two metal contacts 603 and 605 may be of a similar shape. For example, the two metal contacts 605 and 603 shown in FIG. 2(a) are of a rectangle shape. Along the four sides of a rectangle, there is a gap 631, 633, 635, and 637 between each side of the projected image 6051 and each side of the metal contact 603. The gaps 631, 633, 635, and 637 are all shown as bigger than 0 in FIG. 2(a). When the gaps 631, 633, 635, and 637 are non-zero around each side, the metal contact 603 is said to be strictly smaller than the metal contact 605, and the metal contact 605 is said to be strictly bigger than the metal contact 603. The metal contact 605 and the metal contact 603 may be of other shapes, such as a circle, an octagon, a square, an elongated hexagon with two trapezoids on opposite ends of the elongated hexagon, an oval, or a diamond, in top views.

Furthermore, the metal contacts 605 and 603 may be of different shapes. For example, the metal contact 605 may be a rectangle and the metal contact 603 may be a circle as shown in FIG. 2(b). The gaps may be defined around the four sides of the projected image 6051 of the metal contact 605, as the gaps 631, 633, 635, and 637 shown in FIG. 2(b). When the gaps are non-zero around each side, the metal contact 603 is said to be strictly smaller than the metal contact 605, and the metal contact 605 is said to be strictly bigger than the metal contact 603.

On the other hand, when the gap between an edge of the projected image 6051 and a corresponding edge of the metal contact 603 is substantially close to 0, then the metal contact 605 may not be strictly larger than the metal contact 603. FIG. 2(c) illustrates an example where the gaps between the edges of the projected image 6051 and the edges of the metal contact 603 are close to 0 on all sides. In this case, it is called that the metal contact 603 is substantially overlapped with the projected image of the metal contact 605 projected to the metal layer containing the metal contact 603, or simply that the metal contact 603 is substantially overlapped with the metal contact 605 at different layers, or the metal contacts 603 and 605 are substantially overlapped at different layers.

In more general terms, when the metal contacts 605 and 603 are of any convex shapes, the metal contact 605 is substantially vertically above the metal contact 603 when the metal contact 603 is contained within the projected image 6051 of the metal contact 605 at the metal layer containing the metal contact 603. The metal contact 605 is strictly larger than the metal contact 603 if there is a non-zero distance along each point of the perimeter of the projected image 6051 to the corresponding point of the perimeter of the metal contact 603.

Figure 2E:
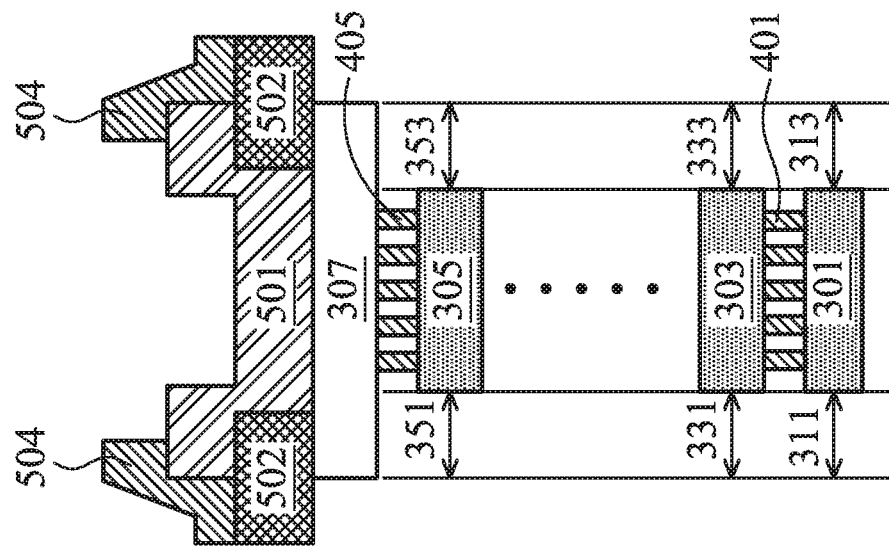
Figure 2D:
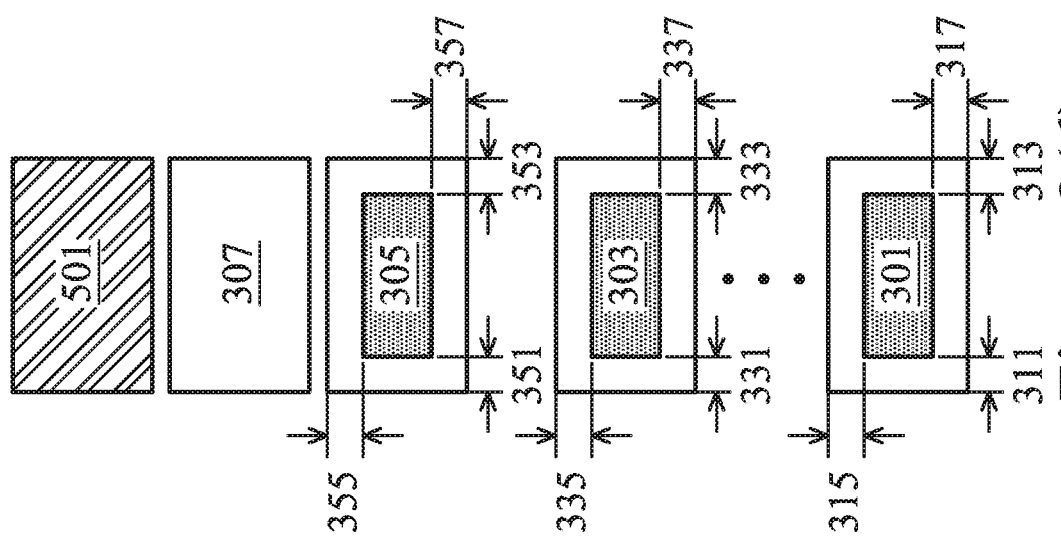

Based on the illustrations in FIGS. 2(a)-2(c), an embodiment of the metal contacts 301, 303, 305, and 307 under the ground-up contact pad 501 of FIG. 1 are shown in FIGS. 2(d)-2(e) and described below.

FIG. 2(d) illustrates a top view of the contact pad 501, the top metal contact 307, the bottom metal contact 301, and the middle metal contacts 305 and 303 within the middle metal layers 105 and 103. The contact pad 501 is substantially vertically above the top metal contact 307, and all other metal contacts 305, 303, and 301. The top metal contact 307 is substantially vertically above the metal contacts 305, 303, and 301, among which the metal contact 305 is said to be substantially vertically next below the top metal contact 307. The metal contact 305 is substantially vertically above the metal contacts 303 and 301, among which the metal contact 303 is substantially vertically next below the metal contact 305. Finally, the metal contact 303 is substantially vertically above the bottom metal contact 301, and the bottom metal contact 301 is also substantially vertically next below metal contact of the metal contact 303. In general, a metal contact A has a substantially vertically next below metal contact B if the metal contact A is in a metal layer one layer above the metal layer containing the metal contact B, and the metal contact A is substantially vertically above the metal contact B.

In more general terms, when there is a plurality of middle metal layers above the bottom metal layer 101 and below the top metal layer 107, for any given metal layer of the plurality of middle metal layers, there is a metal contact contained within the given metal layer, which may be called a middle metal contact. For example, as shown in FIG. 1, if the given metal layer is the layer 105 of the plurality of middle metal layers, the metal contact contained within the given metal layer 105 is the metal contact 305. Furthermore, the metal contact in the given metal layer of the plurality of middle metal layers is substantially vertically below the top metal contact and substantially vertically above the bottom metal contact. For example, the metal contact 305 in the given metal layer 105 is substantially vertically below the top metal contact 307 and substantially vertically above the bottom metal contact 301. In addition, the metal contact in the given metal layer of the plurality of middle metal layers is substantially vertically above a metal contact in any metal layer that is below the given metal layer. For example, the metal contact 305 in the given metal layer 105 is substantially vertically above a metal contact in any metal layers that is below the given metal layer 105, which is the metal contact 303 in the metal layer 103.

As illustrated in FIG. 2(d), the top metal contact 307 is substantially overlapped with the projected image of the contact pad 501 projected onto the top metal layer. It may be advantageous to have the top metal contact 307 substantially overlapped with the projected image of the contact pad 501 projected onto the top metal layer, because in this way the top metal contact 307 can provide a strong support to the contact pad 501 without occupying too much area. If the top metal contact 307 is strictly smaller than the contact pad 501, the top metal contact 307 may not be able to provide a strong support for the contact pad 501. Furthermore, the metal contacts 305, 303, and 301 are all substantially overlapped at different layers. The gaps at each layer such as the gaps 351, 353, 355, and 357 around the middle metal contact 305, the gaps 331, 333, 335, and 337 around the middle metal contact 303, 311, 313, 315, and 317 around the middle metal contact 301, are the gaps compared to the projected image of the top metal contact 307 projected to the corresponding metal layers respectively. All these gaps have similar values in a one-to-one corresponding way. For example, the gaps 311, 331, and 351 are of similar value.

As illustrated in FIG. 2(d), the metal contacts 307, 305, 303, and 301 are all of a rectangle shape. The metal contacts 305, 303, and 301 are of a rectangle shape with a substantially similar length which is less than a length of the top metal contact 307, and with a substantially similar width which is less than a width of the top metal contact 307. For example, the top metal contact 307 may be of a rectangle shape with a length from about 30 µm to about 200 µm and a width from about 30 µm to about 100 µm, while other metal contacts 305, 303, and 301 may be of a rectangle shape with a substantially similar length from about 20 µm to about 190 µm, and with a substantially similar width from about 20 µm to about 90 µm.

FIG. 2(e) illustrates a cross-section view of the metal contacts 301, 303, 305, and 307 and contact pad 501 shown in FIG. 2(d), in addition to the passivation layer 502 and the dielectric layer 504. The top metal contact 307 is substantially overlapped with the projected image of the contact pad 501 projected onto the top metal layer. The metal contacts 305, 305, and 301 are of substantially similar length as shown in FIG. 2(d). The distance 351 corresponds to the gap 351 shown in FIG. 2(d) between an edge of the projected image of the top metal contact 307 and an edge of the metal contact 305. Similarly, the distance 353 corresponds to another gap 353 in FIG. 2(d). The two distances 351 and 353 on the two sides of the metal contact 305 may be of a similar value, or may be of a different value. Other distances 331, 333, 311, and 313 are similarly described and correspond to the gaps 331, 333, 311, and 313 in FIG. 2(d).

FIGS. 3(a)-3(e) illustrate various additional embodiments of the formation of a plurality of metal contacts under the ground-up contact pad 501.

FIG. 3(a) is the same as the FIG. 2(e) in cross-section view. All the middle metal contacts 305, 303 at the middle metal layers and the bottom metal contact 301 are of a rectangle shape with substantially similar length and width. Furthermore, they are substantially overlapped at different layers, and are all strictly smaller than the top metal contact 307.

Alternatively as shown in FIG. 3(b), the middle metal contact 305 is substantially overlapped with the top metal contact 307 at different layers, while the middle metal contact 303 is substantially overlapped with the bottom contact 301 at different layers.

Alternatively as shown in FIG. 3(c), the top metal contact 307 is strictly larger than the metal contact 305 substantially vertically next below the top metal contact 307. The metal contact 305 is strictly larger than the metal contact 303 substantially vertically next below the metal contact 305. The metal contact 303 is strictly larger than the metal contact 301 substantially vertically next below the metal contact 303. In general, if there are multiple middle metal layers, then for any given metal layer of the multiple middle metal layers, the metal contact in the given metal layer may be strictly larger than a metal contact substantially vertically next below the metal contact.

Figure 3E:
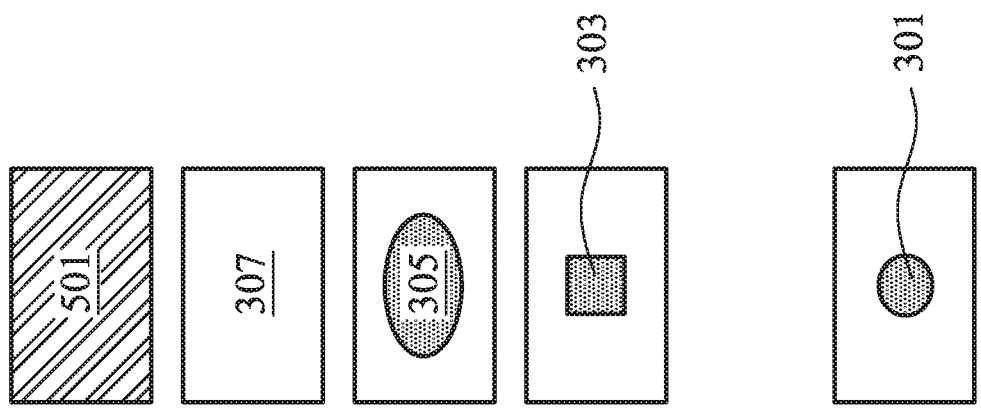
Figure 3D:
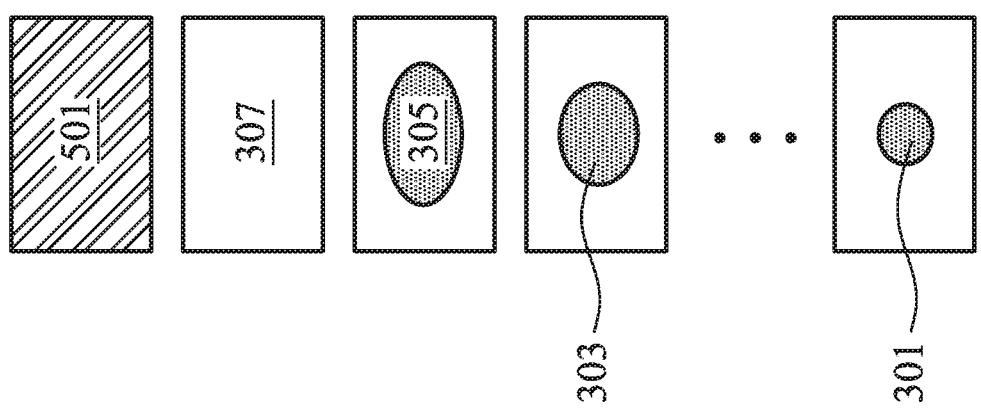

The metal contacts 307, 305, 303, and 301 shown in FIGS. 3(a)-3(c) are all of a rectangle shape. Other shapes of metal contacts are possible. As illustrated in FIG. 3(d), the metal contacts 305, 303, and 301 are of a circular shape while the top metal contact 307 and the contact pad 501 are of a rectangle shape. It may be advantageous to have the top metal contact 307 and the contact pad 501 to be of a same or similar shape. Furthermore, as shown in FIG. 3(e), the metal contact 303 is a rectangle and the metal contacts 305 and 301 are circles. There may be many other ways to mix the shapes of the middle metal contacts and the bottom metal contacts. In FIGS. 3(d)-3(e), the top metal contact 307 is strictly larger than the metal contact 305 substantially vertically next below the top metal contact 307. The metal contact 305 is strictly larger than the metal contact 303 substantially vertically next below the metal contact 305. The metal contact 303 is strictly larger than the metal contact 301 substantially vertically next below the metal contact 303.

FIGS. 4(a)-4(c) illustrate further additional embodiments of the formation of a plurality of metal layers 101, 103, 105, and 107 under a ground-up contact pad 501, where a metal layer may comprise multiple metal contacts.

FIG. 4(a) illustrates an embodiment where there is a plurality of metal contacts 3051, 3053 at the middle metal layer 105, which are all substantially vertically below the metal contact 307, which is the metal contact at a layer immediately above the middle metal layer 105. Alternatively, there may be even more metal contacts in a metal layer such as the six metal contacts in the metal layer 105 and the metal layer 103 shown in FIG. 4(b) in a top view.

As illustrated in FIG. 4(a), for any metal layers below the metal layer 105, there is a plurality of metal contacts at each layer as well. For example, the two metal contacts 3031 and 3033 are at the middle metal layer 103 below the metal layer 105, and the two metal contacts 3011 and 3013 are at the bottom metal layer 101. Furthermore, the metal contact 3011 is substantially vertically below the metal contact 3031, which is further substantially vertically below the metal contact 3051. Similarly, the metal contact 3013 is substantially vertically below the metal contact 3033, which is further substantially vertically below the metal contact 3053. In general, any metal contact below the metal layer 105 is substantially vertically below one of the plurality of metal contacts of the metal layer 105.

The multiple metal contacts shown in FIGS. 4(a)-4(b) at layers 105, 103, and 101 are of substantially similar size and substantially overlapped with other metal contacts at different layers. Alternatively, the multiple metal contacts at one layer can be of different sizes from the multiple metal contacts at a different layer. As shown in FIG. 4(c), the middle metal layer 105 may still comprise one metal contact 305 substantially vertically below the top metal contact 307. The middle metal layer 103 may comprise a plurality of metal contacts 3031 and 3033, and the bottom metal layer 101 may comprise a plurality of bottom metal contacts 3011 and 3013. The bottom metal contact 3011 is substantially vertically below and strictly smaller than the metal contact 3031. The bottom metal contact 3013 is substantially vertically below and strictly smaller than the metal contact 3033.

According to an embodiment, a device includes a bottom metal layer, the bottom metal layer comprising a bottom metal contact, a top metal layer above the bottom metal layer, the top metal layer comprising a top metal contact, and a contact pad substantially vertically above the top metal contact, a major surface of the contact pad physically contacting a major surface of the top metal contact. The device further includes a first middle metal layer between the top metal layer and the bottom metal layer, the first middle metal layer comprising a plurality of first middle metal contacts, wherein the plurality of first middle metal contacts are disposed vertically below and within a lateral extent of the contact pad, wherein the contact pad and the top metal contact have a same size and shape in a plan view, and wherein each of the bottom metal contact and the plurality of first middle metal contacts has a shorter length and a shorter width than a length and a width of the top metal contact.

According to another embodiment, a device includes a bottom metal layer, the bottom metal layer comprising a bottom metal contact, a first middle metal layer above the bottom metal layer, the first middle metal layer comprising a plurality of first middle metal contacts, and a top metal layer above the first middle metal layer, the top metal layer comprising a top metal contact above the plurality of first middle metal contacts. The device further includes a contact pad above the top metal contact, a bottom surface of the contact pad being in physical contact with the top metal contact, wherein the plurality of first middle metal contacts are disposed below and within a lateral extent of the contact pad, wherein the contact pad and the top metal contact have a same size and shape in a plan view, wherein each of the plurality of first middle metal contacts is smaller in all dimensions than the contact pad in the plan view, and wherein the bottom metal contact is smaller in all dimensions than each of the plurality of first middle metal contacts in the plan view.

According to yet another embodiment, a device includes a bottom metal layer, the bottom metal layer comprising a bottom metal contact, a top metal layer over the bottom metal layer, the top metal layer comprising a top metal contact, and a contact pad over the top metal contact, a major surface of the contact pad being in physical contact with a major surface of the top metal contact. The device further includes a middle metal layer between the bottom metal layer and the top metal layer, the middle metal layer comprising a middle metal contact, wherein the middle metal contact and the bottom metal contact are disposed vertically below and within a perimeter of the contact pad in a plan view, wherein the contact pad and the top metal contact have a same size and shape in the plan view, wherein the middle metal contact is smaller in all dimensions than the contact pad in the plan view, and wherein the bottom metal contact is smaller in all dimensions than the middle metal contact in the plan view.

According to yet another embodiment, a device includes a first metal layer. The first metal layer includes a first metal contact. The device further includes a contact pad substantially vertically above the first metal contact, and a second metal layer between the contact pad and the first metal layer. The second metal layer includes a plurality of second metal contacts. The plurality of second metal contacts are disposed vertically below and within a lateral extent of the contact pad. Each of the first metal contact and the plurality of second metal contacts has a shorter length and a shorter width than the contact pad in a plan view.

According to yet another embodiment, a device includes a first metal layer, a second metal layer above the first metal layer, and a contact pad above the second metal layer. The first metal layer includes a first metal contact. The second metal layer includes a plurality of second metal contacts. The plurality of second metal contacts are disposed below and within a lateral extent of the contact pad. Each of the plurality of second metal contacts is smaller in all dimensions than the contact pad in a plan view. The first metal contact is smaller in all dimensions than each of the plurality of second metal contacts in the plan view.

According to yet another embodiment, a device includes a first metal layer, a contact pad over the first metal contact, and a second metal layer between the first metal layer and the contact pad. The first metal layer includes a first metal contact. The second metal layer includes a second metal contact. The second metal contact and the first metal contact are disposed vertically below and within a perimeter of the contact pad in a plan view. The second metal contact is smaller in all dimensions than the contact pad in the plan view. The first metal contact is smaller in all dimensions than the second metal contact in the plan view.

According to yet another embodiment, a device includes a first metal layer, the first metal layer including a first metal contact, a contact pad vertically above the first metal contact, and a second metal layer between the contact pad and the first metal layer. The second metal layer includes a plurality of second metal contacts. The plurality of second metal contacts are disposed vertically below the contact pad. Each of the first metal contact and the plurality of second metal contacts has a shorter width than the contact pad.

According to yet another embodiment, a device includes a first metal layer, a second metal layer above the first metal layer, and a contact pad above the second metal layer. The first metal layer includes a first metal contact. The second metal layer includes a plurality of second metal contacts. The plurality of second metal contacts are disposed below the contact pad. Each of the plurality of second metal contacts has a shorter width than the contact pad. The first metal contact has a shorter width than each of the plurality of second metal contacts.

According to yet another embodiment, a device includes a first metal layer, the first metal layer including a first metal contact, a contact pad over the first metal contact, a second metal layer between the first metal layer and the contact pad, and an insulating layer over the contact pad. The second metal layer includes a second metal contact. The first metal contact and the second metal contact are disposed vertically below the contact pad. The second metal contact has a shorter width than the contact pad. The first metal contact has a shorter width than the second metal contact. The insulating layer is in physical contact with a top surface of the contact pad.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A device comprising:
a first metal layer, the first metal layer comprising a first metal contact;
a contact pad vertically above the first metal contact;
a second metal layer between the contact pad and the first metal layer, the second metal layer comprising a plurality of second metal contacts, wherein the plurality of second metal contacts are disposed vertically below the contact pad, and wherein each of the first metal contact and the plurality of second metal contacts has a shorter width than the contact pad; and
a third metal layer between the contact pad and the second metal layer, wherein the third metal layer comprises a third metal contact, wherein the third metal contact is disposed vertically below the contact pad, and wherein the third metal contact and the contact pad have a same width.

2. The device of claim 1, further comprising a UBM layer over the contact pad.

3. The device of claim 2, further comprising a connector over the UBM layer, wherein the UBM layer electrically couples the connector to the contact pad.

4. The device of claim 1, wherein the contact pad has a thickness between about 0.5 µm and about 4 µm.

5. The device of claim 1, wherein the first metal contact has a shorter width than each of the plurality of second metal contacts.

6. The device of claim 1, further comprising a passivation layer over the second metal layer.

7. The device of claim 6, wherein the passivation layer has a thickness between about 0.5 µm and about 5 µm.

8. A device comprising:
a first metal layer, the first metal layer comprising a first metal contact;
a second metal layer above the first metal layer, the second metal layer comprising a plurality of second metal contacts;
a third metal layer above the second metal layer, the third metal layer comprising a third metal contact; and
a contact pad above the third metal layer, wherein the first metal contact, the plurality of second metal contacts, and the third metal contact are disposed below the contact pad, wherein the third metal contact and the contact pad have a same width, wherein each of the plurality of second metal contacts has a shorter width than the contact pad, and wherein the first metal contact has a shorter width than each of the plurality of second metal contacts.

9. The device of claim 8, further comprising an insulating layer over the contact pad.

10. The device of claim 9, further comprising a UBM layer, wherein the UBM layer extends through the insulating layer and physically contacts the contact pad.

11. The device of claim 10, further comprising a connector physically and electrically coupled to the UBM layer.

12. The device of claim 11, wherein the connector comprises a solder material.

13. The device of claim 10, wherein the UBM layer has a thickness between about 0.01 µm and about 10 µm.

14. The device of claim 9, the insulating layer has a thickness between about 5 µm and about 30 µm.

15. A device comprising:
a first metal layer, the first metal layer comprising a first metal contact;
a contact pad over the first metal contact;
a second metal layer between the first metal layer and the contact pad, the second metal layer comprising a second metal contact, wherein the first metal contact and the second metal contact are disposed vertically below the contact pad, wherein the second metal contact has a shorter width than the contact pad, and wherein the first metal contact has a shorter width than the second metal contact;
a third metal layer between the contact pad and the second metal layer, the third metal layer comprising a third metal contact, wherein the third metal contact is disposed vertically below the contact pad, and wherein the third metal contact and the contact pad have a same width; and
an insulating layer over the contact pad, wherein the insulating layer is in physical contact with a top surface of the contact pad.

16. The device of claim 15, further comprising a UBM layer over the contact pad, wherein the UBM layer comprises:
a first portion extending through the insulating layer and contacting a top surface of the contact pad; and
a second portion over and in physical contact with a top surface of the insulating layer.

17. The device of claim 16, further comprising a connector electrically coupled to the UBM layer, wherein a bottommost surface of the connector is below a topmost surface of the UBM layer.

18. The device of claim 17, wherein the first metal contact and the second metal contact are disposed vertically below the UBM layer.

19. The device of claim 15, wherein the insulating layer is in physical contact with sidewalls of the contact pad.

20. The device of claim 15, wherein the first metal contact is disposed vertically below the second metal contact.

\* \* \* \* \*